United States Patent
Ichikawa

(10) Patent No.: US 9,293,643 B2
(45) Date of Patent: *Mar. 22, 2016

(54) METHOD OF MANUFACTURING LIGHT EMITTING DEVICE INCLUDING LIGHT EMITTING ELEMENT AND WAVELENGTH CONVERTING MEMBER

(71) Applicant: Nichia Corporation, Anan-shi (JP)

(72) Inventor: Masatsugu Ichikawa, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/553,628

(22) Filed: Nov. 25, 2014

(65) Prior Publication Data

US 2015/0118771 A1    Apr. 30, 2015

Related U.S. Application Data

(63) Continuation of application No. 13/639,759, filed as application No. PCT/JP2011/058586 on Apr. 5, 2011, now Pat. No. 8,916,399.

(30) Foreign Application Priority Data

Apr. 8, 2010  (JP) .................................. 2010-089267

(51) Int. Cl.
*H01L 21/00*   (2006.01)
*H01L 33/00*   (2010.01)
(Continued)

(52) U.S. Cl.
CPC ............ *H01L 33/0095* (2013.01); *H01L 33/18* (2013.01); *H01L 33/50* (2013.01);
(Continued)

(58) Field of Classification Search
CPC ........... H01L 33/50; H01L 33/58; H01L 3/60; H01L 33/501; H01L 33/505; H01L 33/18; H01L 33/502; H01L 2933/0041; H01L 2924/0002
USPC ............... 257/12–13, 81, 84, 87–89, 98–100, 257/347–348, 433–434; 313/112, 501, 503, 313/506; 438/22, 48–52
See application file for complete search history.

(56) References Cited

U.S. PATENT DOCUMENTS 8,916,399 B2 * 12/2014 Ichikawa .......................... 438/27
2004/0145308 A1 7/2004 Rossner et al.
(Continued)

FOREIGN PATENT DOCUMENTS

| CN | 101150152 A | 3/2008 |
|----|-------------|--------|
| CN | 102142431 A | 8/2011 |

(Continued)

OTHER PUBLICATIONS

International Search Report issued in PCT/JP2011/058586 dated May 10, 2011.
(Continued)

*Primary Examiner* — Dung Le
(74) *Attorney, Agent, or Firm* — Foley & Lardner LLP

(57) ABSTRACT

A method of manufacturing a light emitting device includes steps of preparing a light emitting element; preparing a wavelength converting member; and bonding the light emitting element and the wavelength converting member to each other using a surface activated bonding technique.

10 Claims, 2 Drawing Sheets

(51) Int. Cl.
   *H01L 33/50* (2010.01)
   *H01L 33/18* (2010.01)

(52) U.S. Cl.
   CPC ........... *H01L 33/501* (2013.01); *H01L 33/502* (2013.01); *H01L 33/505* (2013.01); *H01L 2924/0002* (2013.01); *H01L 2933/0041* (2013.01)

(56) References Cited

U.S. PATENT DOCUMENTS

| | | |
|---|---|---|
| 2004/0217670 A1 | 11/2004 | Ueda et al. |
| 2005/0269582 A1 | 12/2005 | Mueller et al. |
| 2006/0043402 A1 | 3/2006 | Suehiro et al. |
| 2006/0124951 A1 | 6/2006 | Sakata et al. |
| 2006/0202105 A1 | 9/2006 | Krames et al. |
| 2008/0149960 A1 | 6/2008 | Amo et al. |
| 2009/0206359 A1 | 8/2009 | Nabekura |
| 2009/0256167 A1 | 10/2009 | Peeters et al. |
| 2010/0019260 A1 | 1/2010 | Epler et al. |
| 2010/0035406 A1 | 2/2010 | Hachigo |
| 2010/0308365 A1 | 12/2010 | Masuya et al. |
| 2010/0314650 A1 | 12/2010 | Sugimori |
| 2010/0320479 A1 | 12/2010 | Minato et al. |
| 2011/0090696 A1 | 4/2011 | Nagai et al. |
| 2011/0122481 A1 | 5/2011 | Ide et al. |
| 2015/0287896 A1 | 10/2015 | Minato et al. |

FOREIGN PATENT DOCUMENTS

| | | |
|---|---|---|
| EP | 1 191 608 A2 | 3/2002 |
| EP | 1 986 217 A1 | 10/2008 |
| EP | 2 154 708 A2 | 2/2010 |
| JP | 64-010614 A | 1/1989 |
| JP | 11-307813 | 11/1999 |
| JP | 2000-340509 A | 12/2000 |
| JP | 2004-146835 A | 5/2004 |
| JP | 2004-312474 A | 11/2004 |
| JP | 2006-005367 A | 1/2006 |
| JP | 2006-100787 A | 4/2006 |
| JP | 2006-352085 A | 12/2006 |
| JP | 2008-207221 A | 9/2008 |
| JP | 2009-105123 A | 5/2009 |
| JP | 2009-114953 A | 5/2009 |
| JP | 2009-212500 A | 9/2009 |
| JP | 2009-260391 A | 11/2009 |
| JP | 2009-289835 A | 12/2009 |
| JP | 2010-045098 A | 2/2010 |
| JP | 2010-287687 A | 12/2010 |
| TW | 200742127 A | 11/2007 |
| WO | WO-2004/065324 A1 | 8/2004 |
| WO | WO-2008/007232 A2 | 1/2008 |
| WO | WO-2009/069671 A1 | 6/2009 |
| WO | WO-2009/119034 A1 | 10/2009 |

OTHER PUBLICATIONS

Takagi et al., "Direct bonding of two crystal substrates at room temperature by Ar-beam surface activation", Journal of Crystal Growth 292(2006) 429-432.

US Office Action dated May 20, 2015 issued in U.S. Appl. No. 14/553,578.

Extended European Search Report issued in corresponding application No. 11765900.3 dated Oct. 7, 2015.

Office Action issued in corresponding Chinese application No. 201180016791.1 dated Dec. 28, 2015.

Hideki Takagi, "Room-Temperature Wafer Bonding," Journal of the Surface Science Society Japan, vol. 26, No. 2, pp. 82-87 (Feb. 2005).

Office Action for Japanese Patent Application No. 2012-509662 dated Jan. 5, 2016.

\* cited by examiner (a)

(b)

METHOD OF MANUFACTURING LIGHT EMITTING DEVICE INCLUDING LIGHT EMITTING ELEMENT AND WAVELENGTH CONVERTING MEMBER

CROSS-REFERENCE TO RELATED PATENT APPLICATIONS

This application is a continuation of U.S. application Ser. No. 13/639,759, filed Oct. 5, 2012, which is a National Stage of PCT/JP2011/058586, filed Apr. 5, 2011 which claims priority to Japanese Application No. 2010-089267, filed Apr. 8, 2010 the disclosures of which are hereby incorporated by reference in their entirety.

BACKGROUND

1. Technical Field

The present invention relates to a light emitting device in which a light emitting element and a wavelength converting member are bonded, and a method of manufacturing the light emitting device.

2. Description of Background Art

Conventionally, there has been proposed is a light emitting device capable of emitting light of mixed color, by combining light from an LED chip which serves as a light emitting element and light from a fluorescent material which served as a wavelength converting member. For example, Patent Literature 1 describes that a "nucleation layer" made of GaN is grown on a growth substrate made of sapphire, and the "nucleation layer" and a "ceramic phosphor" are bonded at high temperature and high pressure.

CONVENTIONAL ART DOCUMENT

Patent Literature

Patent Literature 1: JP2006-352085A

SUMMARY OF THE INVENTION

Disclosure of Invention

Problem to be Solved by the Invention

However, there has been a problem that, in the light emitting device disclosed in Patent Literature 1, the "growth substrate" made of sapphire and the "nucleation layer" made of GaN are merely thermally compressed and the bonding strength was weak. It is undesirable because weak bonding strength may results in detachment of the growth substrate and the nucleation layer during use.

Accordingly an object of the present invention is to provide a light emitting device having strong bonding strength between the light emitting element and the wavelength converting member.

Means to Solve the Problems

A light emitting device of an embodiment of the present invention includes a light emitting element and a wavelength converting member bonded with each other. Particularly, the light emitting element has, from the wavelength converting member side, a first region and a second region, the wavelength converting member has, from the light emitting element side, a third region and a fourth region, the first region has an irregular atomic arrangement compared with the second region, the third region has an irregular atomic arrangement compared with the fourth region, and the first region and the third region are directly bonded.

According to an embodiment of the present invention, the light emitting element includes a substrate having the first region and the second region and a semiconductor stacked layer portion formed on the substrate. The wavelength converting member has a support member which has the third region and the fourth region and a fluorescent material which is contained in the support member.

Further, according to an embodiment of the present invention, the substrate is made of sapphire and the support member is made of aluminum oxide.

A method of manufacturing a light emitting device according to an embodiment of the present invention includes a step of preparing a light emitting element, a step of preparing a wavelength converting member, and a step of bonding the light emitting element and the wavelength converting member by using a surface activated bonding technique.

It is preferable that the light emitting element has a substrate made of sapphire and a semiconductor stacked portion formed on the substrate, the wavelength converting member has a support member made of aluminum oxide and a fluorescent material contained in the support member, and the substrate and the support member are bonded in the bonding step.

Effect of the Invention

According to the present invention as described above, a light emitting device having strong bonding strength between the light emitting element and the wavelength converting member can be provided.

DETAILED DESCRIPTION

Figure 1:
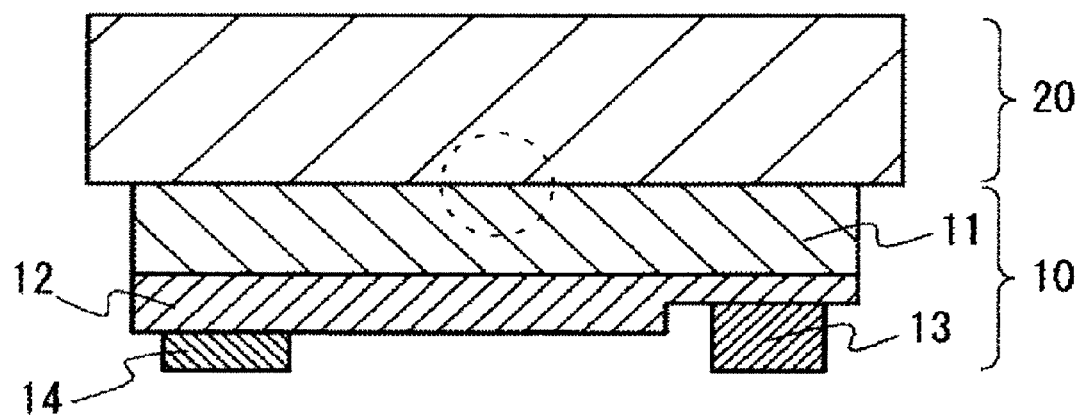
FIG. 1 is a diagram illustrating a cross section of a light emitting device according to the present invention.

The embodiments of the present invention will be described below with reference to the accompanying drawings. The embodiments are intended as illustrative of a light emitting device to give a concrete form to technical ideas of the present invention, and the scope of the invention is not limited to those described below. Particularly, the sizes, materials, shapes and the relative positions of the members described in examples are given as an example and not as a limitation to the scope of the invention unless specifically stated. The sizes and the positional relationships of the members in each of the drawings are occasionally shown exaggerated for ease of explanation. Members same as or similar to those of this invention are assigned the same reference numerals and detailed description thereof will be omitted.

Figure 2:
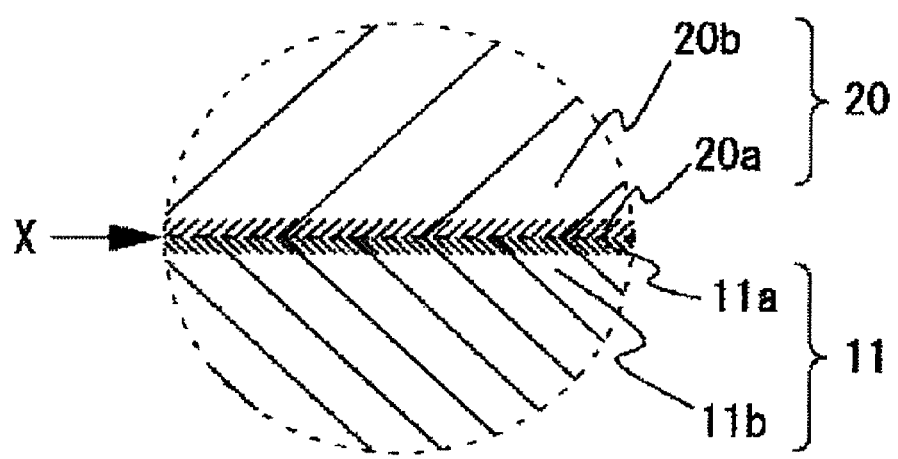
FIG. 2 is an enlarged view of the region of FIG. 1 inside the broken lines.

In a light emitting device according to the present embodiment, a light emitting element 10 and a wavelength converting member 20 are bonded. FIG. 1 is a cross-sectional view in a direction perpendicular to a light emission observation surface of a light emitting device according to an embodiment. FIG. 2 is an enlarged view of the region of FIG. 1 inside the broken line. In a light emitting device according to the present embodiment, a light emitting element 10 has, as shown in FIG. 1 for example, a substrate 11 made of sapphire and a semiconductor stacked layer portion 12 formed on the substrate 11, and a p-electrode 13 and an n-electrode 14 formed on the semiconductor stacked layer portion 12. The wavelength converting member 20 is made of a base member (support member) which serves as a base and a fluorescent material contained in the base member. In the present embodiment, the substrate 11 of the light emitting element 10 has, from the wavelength converting member 20 side, a first region 11a and a second region 11b, and the wavelength converting member 20 has, from the light emitting element 10 side, a third region 20a and a fourth region 20b. In the substrate 11, the first region 11a has an irregular atomic arrangement compared with the second region 11b, and in the wavelength converting member 20, the third region 20a has an irregular atomic arrangement compared with the fourth region 20b. The first region 11a and the third region 20a are directly bonded and thus the light emitting element 10 and the wavelength converting member 20 are bonded.

As described above, in the present specification, the term "first region 11a" indicates a region directly in contact with the wavelength converting member 20 in the light emitting element 10. Also, the term "second region 11b" indicates a region abutting (directly in contact with) the "first region 11a" in the light emitting element 10. In a same manner, the term "third region 20a" indicates a region of the wavelength converting member 20 which is directly in contact with the light emitting element 10. Also, the term "fourth region 20b" indicates a region of the wavelength converting member 20 which is abutting the "third region 20a." As described above, the first region 11a having an irregular atomic arrangement compared with the second region 11b, and the third region 20a having an irregular atomic arrangement compared with the fourth region 20b are directly in contact with each other and bonded to form a bonded interface X, and the second region 11b and the fourth region 20b are respectively spaced apart from the bonding interface X. In the present invention, the first region 11a and the second region 11b (the third region 20a and the fourth region 20b) are abutted to each other, but the first region and the second region have the same composition. Thus, in the case where the members having different compositions are adjacent to each other, they are not indicated as the first region and the second region as in the present invention. More specifically, in the light emitting element having a sapphire substrate and an abutting semiconductor layer, there is no case where the semiconductor layer is indicated as the first region and the sapphire substrate is indicated as the second region. That is, the first region 11a and the second region 11b (the third region 20a and the fourth region 20b) in the present specification are fundamentally a single member with the same composition, but a part of the member is indicated as the first region and a different part of the same member is indicated as the second region. Whether a part belongs to a certain member can be determined, for example, through a cross-sectional observation at atomic level by high-resolution transmission electron microscopy or through a comparison of composition from elemental analysis.

Accordingly, the light emitting element 10 and the wavelength converting member 20 can be firmly bonded. Although the reason is not clear, it is considered that the first region 11a and the third region 20a as a whole is capable of absorbing a strain developed between the light emitting element 10 and the wavelength converting member 20. For example, in the case where the light emitting element 10 and the wavelength converting member 20 are directly bonded through thermal compression, a strain may occur between the light emitting element 10 and the wavelength converting member 20 due to differences in the lattice constant or in the thermal expansion coefficient. As described above, enhancing of the bonding strength between the light emitting element 10 and the wavelength converting member 20 by way of thermal bonding has a limitation. However, it is thought that making the atomic arrangement of the first region 11a and the third region 20a which are adjacent to the bonding interface X irregular than that of the second region 11b and the fourth region 20b enables to efficiently absorb the strain due to the difference in the lattice constant, the thermal expansion coefficient, or the like, and thus, the bonding strength is improved. It is also thought that a high unevenness in the atomic arrangement (preferably in an amorphous state which is in a non-equilibrium metastable state), anisotropic nature due to the crystal structure lessens and "weak" structures such as brittleness, crystal structure, and/or lattice defect which is attributed to the anisotropic nature disappears, and thus the bonding strength can be enhanced. Also, for example, in the case where the light emitting element 10 and the wavelength converting member 20 are bonded through an adhesive agent made of a resin, strain may occur at each interface, because a resin has a relatively large thermal expansion. In contrast, the light emitting device according to the present embodiment does not require a resin to be interposed, so that a stronger bonding can be achieved.

Further, strain at the bonding interface X can be reduced through the first region 11a and the third region 20a, so that generation of stress in the fluorescent materials around the bonding interface X can be suppressed. The wavelength converting member 20 contains a fluorescent material, so that stress associated with heat generation in the fluorescent material tends to occur. Generation of stress in the fluorescent material may cause an increase in the half bandwidth of the emission spectrum and decrease in the luminous flux, and thus undesirable. However, according to the present embodiment, an adverse influence of the strain on the fluorescent material can be reduced. In the present invention, the light emitting element 10 and the wavelength converting member 20 are directly bonded. Therefore, compared with the case where the light emitting element 10 and the wavelength converting member 20 are connected by an adhesive agent made of a resin which inherently has a poor thermal conductivity, it is also possible that the heat generated in the wavelength converting member 20 can be efficiently released to the light emitting element 10 side. With this arrangement, a strain generated in the bonding surface X can be further reduced.

Further, directly bonding the light emitting element 10 and the wavelength converting member 20 enables to reduce the number of the interfaces which reflect light (or totally reflect light depends on the angle of incidence) to one, and thus enables to improve the extraction of light as a whole device. For example, in the case where an adhesive made of a resin in interposed between the light emitting element 10 and the wavelength converting member 20, a sum of two interfaces (an interface between the light emitting element and the adhesive agent and an interface between the wavelength converting member and the adhesive agent) exist. On the other hand, in the case where the light emitting element 10 and the wavelength converting member 20 are directly bonded, only one interface (interface between the light emitting element 10 and the wavelength converting member 20) exists. Therefore, compared to the former, the latter is capable of decrease the optical loss. Also, a use of an adhesive agent made of a resin results in a high reflectance at the interface due to a large difference in the refractive indices between the inorganic materials constituting the substrate and the resin which is an organic material. In contrast, the present invention is capable of reducing the difference in the refractive indices between the substrate 11 which constitutes a part of the light emitting element and the wavelength converting member 20, and thus reflection at the interface can be reduced.

The first region 11a or the third region 20a, or the both regions are preferably made of amorphous having higher atomic irregularity, and more preferably in a metastable, non-equilibrium amorphous state. With this arrangement, the strain between the light emitting element 10 and the wavelength converting member 20 can be more efficiently prevented, anisotropy due to crystal structure can be further reduced, crystal structures and/or lattice defects can be eliminated, and the bonding strength can be further enhanced.

Either the second region 11b or the fourth region 20b (preferably the both) may be preferably made of a polycrystal or a single crystal, more preferably made of a single crystal. The second region 11b and/or the fourth region 20b being a polycrystal or a single crystal (particularly a single crystal) is thought to induce the strain therebetween. Thus, the present embodiment is particularly effective in such a state.

From a view point of reducing the strain, the first region 11a and the third region 20a are preferably disposed on substantially the entire area of the bonding interface X. However, in the present invention, the region to which the first region 11a and the third region 20a are directly bonded may be a part of the bonding interface X, and which is in the scope of the present invention as long as it exerts the effects as described above.

The first region 11a and the third region 20a respectively have a thickness of preferably 1 nm to 20 nm, further preferably 2 nm to 10 nm. With this arrangement, the effect of reducing the strains can be sufficiently obtained, so that the bonding strength can be enhanced. Further, making the first region 11a and the third region 20a with an irregular atomic arrangement may adversely affect the extraction of light, but in the range as described above, the thickness of the portion of optical attenuation can be substantially reduced, and thus optical loss can be reduced.

For the light emitting device according to the present embodiment, the light emitting element 10 is not limited and a known light emitting element can be used. For example, as shown in FIG. 1, the light emitting element 10 may be include a substrate 11, a semiconductor stacked layer portion 12 disposed on the substrate 11, and a pair of electrodes 13 and 14 disposed on the same surface side of the semiconductor stacked layer portion 12. For the substrate 11, sapphire, GaN, or the like, can be employed. For the semiconductor stacked layer portion 12, a stacked layer of a plurality of nitride semiconductor layers (AlInGaN), or the like, can be employed. In view of extraction of light, the wavelength converting member 20 side is preferably used as the viewing side.

In the case where sapphire is used as the substrate 11 of the light emitting element 10, it is preferable that the support member, which to be described later, of the wavelength converting member 20 is made of aluminum oxide and that the sapphire and the aluminum oxide are directly bonded. That is, the first region 11a and the second region 11b are formed in the sapphire and the third region 20a and the fourth region 20b are formed in the aluminum oxide, and the first region 11a and the third region 20a are directly bonded.

With this arrangement, the same compositional elements can be used for the substrate and the support member, so that bonding strength of the both can be further enhanced. Further, the refractive indices of the substrate and the support member can made substantially the same, so that the total reflection of light at the interface can be reduced and light extraction of the light emitting device can be improved. Although the effects described above can be achieved regardless of the crystal structures of aluminum oxide which constitutes the support member, the crystal structure of aluminum oxide may be preferably a polycrystal or a single crystal, more preferably a single crystal (sapphire). With this arrangement, a similar or the same structure as the substrate made of sapphire can be obtained and therefore the effects as described above can be easily obtained.

In another variant example, in a light emitting element 10, after forming a semiconductor stacked layer portion on a substrate, a bonding substrate such as Si is adhered to the semiconductor stacked layer structure, then the initial substrate is removed and the bonding substrate and a wavelength converting member may be bonded. Further, regardless of whether a substrate is used, the semiconductor stacked layer portion and the wavelength converting member can be bonded. In the case where the semiconductor stacked layer portion and the wavelength converting member are bonded, one semiconductor layer at the most outer side of the semiconductor stacked layer portion to be bonded to the wavelength converting member has, from the wavelength converting member side, a first region and a second region, and the first region has an irregular atomic arrangement compared with the second region.

For the light emitting device according to the present embodiment, the wavelength converting member 20 is capable of converting light from the light emitting element 10 into light having different wavelength distribution, and the material thereof is not limited, and a known material can be used. The wavelength converting member 20 may be a fluorescent material, or may includes a fluorescent material and a support member which support the fluorescent material. In the case where the wavelength converting member 20 includes a fluorescent material and a support member, for example, the wavelength converting member 20 is an eutectic of a fluorescent material and a support member formed by using an irreversible coagulation technique, or the wavelength converting member 20 is integrally formed by sintering a fluorescent material powder and a material powder of the support member.

The fluorescent material is not limited and a known fluorescent material can be used. For example, a YAG (yttrium aluminum garnet) based fluorescent material and/or a TAG (terbium aluminum garnet) based fluorescent material may be used. With this arrangement, for example, by mixing blue emission from the light emitting element 10 and yellow emission from the fluorescent material, white light can be emitted.

The support member is not limited and a known support member can be used. For example, aluminum oxide, aluminum nitride, YAG (non-luminous, because an activator is not contained), and/or yttrium oxide can be used.

The fluorescent material has a base member and an activator, and the support member is preferably made of the same materials as the base member. With this arrangement, the difference in the refractive indices between the fluorescent material and the support member can be substantially eliminated. As a result, total reflection of light at the interface between the support member and the fluorescent material can be substantially reduced, and the light extraction efficiency as the entire light emitting device can be improved. Further, employing the same materials for the support member and the base member enables to reduce the stress generated in the fluorescent material. For example, a YAG (non-luminous, because an activator is not contained) can be used for the support member and a so-called YAG-based fluorescent material with cerium as the activator and a YAG as the base member, can be used for the fluorescent material.

Figure 3A:
FIG. 3A(a) is a cross-sectional view illustrating a light emitting element preparation step of preparing a light emitting element 10 in a method of manufacturing a light emitting device according to an embodiment of the present invention, and FIG. 3A(b) is a cross-sectional view illustrating a wavelength converting member preparation step of preparing a wavelength converting member 20.
Figure 3A:
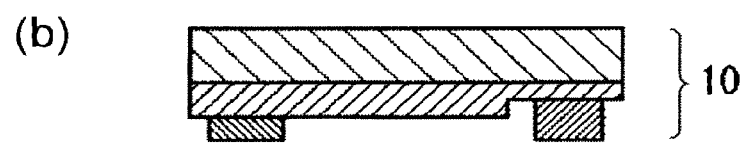
Figure 3B:
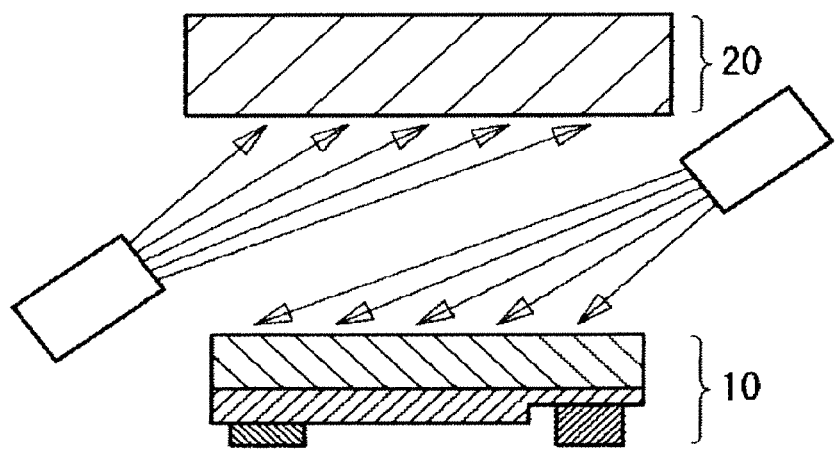
FIG. 3B is a cross sectional view illustrating a step of activating the bonding surface in a method of manufacturing a light emitting device according to an embodiment of the present invention.
Figure 3C:
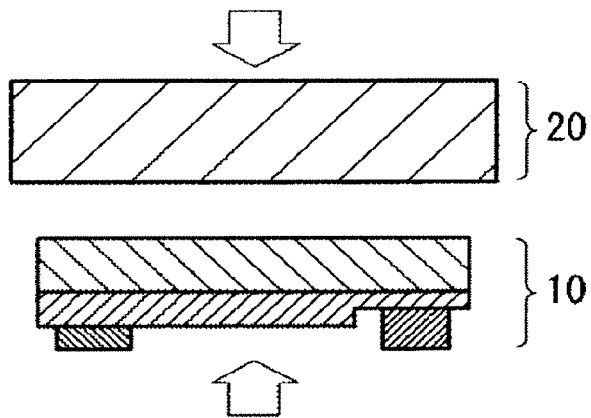
FIG. 3C is a cross-sectional view illustrating a bonding step of a method of manufacturing a light emitting device according to an embodiment of the present invention.

As shown in FIG. 3, a method of manufacturing a light emitting device according to an embodiment of the present invention includes a step of preparing a light emitting element 10 (see FIG. 3A(a)), a step of preparing a wavelength converting member 20 (see FIG. 3A(b)), and a bonding step for bonding the light emitting element 10 and the wavelength converting member 20 (see FIGS. 3B and 3C).

In the present embodiment, the term "surface activated bonding technique" refers to that carrying out sputter etching by using ion beams or plasma on a bonding surface of a light emitting element 10 and a wavelength converting member 20 to activate both the surfaces to be bonded, then directly bond the light emitting element 10 and the wavelength converting member 20 at the bonding surfaces.

Accordingly, the light emitting element 10 and the wavelength converting member 20 can be firmly bonded. This is considered as the result of sputter etching, the first region 11a and the third region 20a are formed and the both absorb the strain between the light emitting element 10 and the wavelength converting member 20 in an integrated manner (see FIG. 2). The details are as described above and will not be repeated here.

Generally, a light emitting element is fabricated in such a manner that a column-shaped ingot of sapphire is thinly sliced to obtain disk-shaped wafers, and on each wafers, a plurality of semiconductor stacked layer portion as 12 are formed and then divided into each of the light emitting elements. In the present invention, at the time of bonding the light emitting element 10 and the wavelength converting member 20 by using a surface activated bonding technique, prior to dividing into each of the light emitting elements, a wafer on which a plurality of semiconductor stacked layer portions 12 are formed and the wavelength converting member 20 may be bonded, or after dividing into each of the light emitting elements, the wavelength converting member 20 is bonded to each of the light emitting element 10, by using a surface activated bonding technique. However, in the case where the light emitting element 10 and the wavelength converting member 20 are bonded by using a surface activated bonding technique, the use of the light emitting elements 10 which are already divided into single units has an advantage as described below (in the present specification, not only the state of individually divided unit but also the previous state of the wafer are also referred to a "light emitting element." That is, generally, the light emitting elements formed on a wafer have different properties such as the peak wavelength and/or optical output power depending on their locations on the wafer. However, such light emitting elements obtained by dividing the wafers can be grouped together by selecting the same or similar properties, and appropriate wavelength converting members 20 can be selected and bonded respectively thereto. Examples of specific steps include arranging a plurality of light emitting elements having similar properties on a single adhesive sheet (first step), bonding each of the light emitting elements arranged on the adhesive sheet with a single sheet of a wavelength converting member by using a surface activated bonding technique (second step), removing the adhesive sheet (third step), and cutting the wavelength converting member as needed to obtain individual light emitting devices (fourth step).

Heating the light emitting element may result in deterioration of the electrodes and/or the light emitting layer, but a surface activated bonding technique is not necessarily heated. Thus, the light emitting element 10 and the wavelength converting member 20 can be bonded without deteriorating the properties of the light emitting element. Although according to the materials and construction of the electrodes and the material and the construction of the semiconductor stacked layer portion, the range of temperature to perform a surface activated bonding technique may be preferably 0° C. to 300° C., more preferably 0° C. to 200° C., further preferably 0° C. to 100° C., yet further preferably 0° C. to 50° C. With this arrangement, a firm bonding can be achieved without undermining the properties of the light emitting element.

The bonding surfaces of the light emitting element 10 and the wavelength converting member 20 may have a surface roughness (Ra) of 10 nm or less, more preferably 5 nm or less, and further preferably 1 nm or less. Accordingly, the light emitting element 10 and the wavelength converting member 20 can be easily and firmly bonded.

Though, depending on the material and state of the bonding surface of the light emitting element 10 and the bonding surface of the wavelength converting member 20, bonding of the both by using a surface activated bonding technique may be difficult. Even in such a case, forming a bonding member capable of bonding to the both on one or both of the light emitting element 10 and the wavelength converting member 20 enables bonding of the both. For example, with a use of surface activated bonding technique, a glass (including a fluorescent material) is difficult to be bonded to the sapphire substrate of the light emitting element. For this reason, a bonding member such as aluminum oxide is formed on the glass surface by using sputtering or the like, which enables bonding of aluminum oxide and the sapphire substrate by using a surface activated bonding technique. In this case, the wavelength converting member 20 is made of a fluorescent material, a support member (glass) and a bonding member (aluminum oxide), and the bonding member has, from the light emitting element side, a third region and a fourth region, and the third region has an irregular atomic arrangement compared with the fourth region.

Example 1

Light Emitting Element 10

Respective layers of nitride semiconductor were grown on a sapphire substrate 11 to form a semiconductor stacked layer portion 12. An n-electrode 13 and a p-electrode 14 were formed on a part of a predetermined portion of the semiconductor stacked layer portion 12. The sapphire substrate in a wafer state was ground to reduce the thickness to about 85 micrometers. Further, using a CMP (Chemical Mechanical Polishing) technique, scratch marks left by the polishing are removed and the surface was smoothed to an Ra of 1 nm or less. The light emitting element in a wafer state obtained as described above was cut out by scrubbing to obtain individual light emitting elements 10. In the present example, each light emitting element 10 of 1 mm long and 1 mm wide in a plan view was formed.

Characterization such as voltage characteristic, wavelength, and leakage were carried out on each of the light emitting elements 10 and the light emitting elements 10 were sorted into groups on the basis of their characteristics. The light emitting elements 10 of respective groups were arranged on a respective adhesive sheet at an interval of 200 micrometers with each other.

(Wavelength Converting Member 20)

A wavelength converting member 20 formed by using an irreversible coagulation technique is prepared. The wavelength converting member 20 of the present example was made of a sapphire (support member) containing YAG (fluorescent material). In conformity with the chromaticity of a desired white LED (light emitting device), the wavelength converting member 20 was ground and polished to a desired thickness. Next, in order to further smooth the surface which is to serve as the bonding surface, polishing and CMP were carried out. At this time, due to the difference in the polishing rate, the sapphire portion becomes in a protruded shape and the YAG portion becomes a recesses shape, but in the present example, the difference in the height of the sapphire portion and the YAG portion is adjusted to 10 nm or less. The surface roughness of the YAG and the sapphire at the bonding surface were respectively adjusted to the Ra of 2 nm or less.

(Surface Activated Bonding)

On the upper part of the bonding chamber, a plurality of the light emitting elements 10 were arranged on an adhesive sheet so that the sapphire substrates 11 which serve as the bonding surfaces locate to the underside. At the lower part of the bonding chamber, the wavelength converting member 20 was placed so that its bonding surface locates to the upper side.

The bonding chamber was vacuumed to $8.0 \times 10^{-6}$ Pa or less. Then, using two fast ion beam (FAB: fast atom beam) guns, Ar ion beam was irradiated respectively on the upper and lower samples. Ar beam was irradiated with a flow rate of 40 scm, an acceleration current of 100 mA, and for 180 seconds. Then, the upper and lower samples were bonded within a short time of 30 seconds or less. At this time, a pressure of 0.2 N/mm$^2$ or more was applied on the samples for 30 seconds. The bonded sample was taken out from the bonding chamber and the adhesive sheet was removed from the sample.

(Chip Separation and Others)

A plurality of the light emitting elements 10 arranged on a single sheet of the wavelength converting member 20 are divided by dicing to obtain individual units of the light emitting devices. One of the light emitting device was mounted in a flip chip manner on a circuit board having electrodes and covered with a white resin made of titania particles dispersed in a silicone resin, except for the upper surface of the wavelength converting member 20 which serve as the light emitting surface.

The light emitting devices obtained in the present example were confirmed to have approximately twice as much improvement in the die shear strength (bonding strength) as compared to the devices of Comparative Example. Further, compared to comparative Example, an approximately 10% improvement in the luminous flux was confirmed.

Comparative Example

The light emitting devices having substantially the same structure as in Example 1 were fabricated except that the sapphire substrate and the wavelength converting member were bonded by using an adhesive material made of a silicone resin.

INDUSTRIAL APPLICABILITY

The light emitting device according to an embodiment of the present invention can be used, for example, for lighting devices and display devices.

DENOTATION OF REFERENCE NUMERALS 10 light emitting element
11 substrate
11a first region
11b second region
12 semiconductor stacked layer portion
13 p-electrode
14 n-electrode
20 wavelength converting member
20a third region
20b fourth region

What is claimed is:

1. A method of manufacturing a light emitting device comprising steps of:
    preparing a light emitting element;
    preparing a wavelength converting member; and
    bonding the light emitting element and the wavelength converting member to each other using a surface activated bonding technique.

2. The method of manufacturing a light emitting device according to claim 1,
    wherein the light emitting element comprises:
        a substrate, and
        a semiconductor stacked layer portion formed on the substrate,
    wherein the wavelength converting member comprises:
        a support member, and
        a fluorescent material contained in the support member, and
    wherein, in the step of bonding, the substrate and the support member are bonded to each other.

3. The method of manufacturing a light emitting device according to claim 2, wherein the fluorescent material comprises one of an yttrium aluminum garnet based fluorescent material and a terbium aluminum garnet based fluorescent material.

4. The method of manufacturing a light emitting device according to claim 1, wherein a temperature to perform a surface activated bonding technique is set not less than 0° C. nor more than 300° C.

5. The method of manufacturing a light emitting device according to claim 1, wherein a temperature to perform a surface activated bonding technique is set not less than 0° C. nor more than 200° C.

6. The method of manufacturing a light emitting device according to claim 1, wherein a temperature to perform a surface activated bonding technique is set not less than 0° C. nor more than 100° C.

7. The method of manufacturing a light emitting device according to claim 1, wherein bonding surfaces of the light emitting element and the wavelength converting member have a surface roughness (Ra) of 10 nm or less.

8. The method of manufacturing a light emitting device according to claim 1, wherein bonding surfaces of the light emitting element and the wavelength converting member have a surface roughness (Ra) of 5 nm or less.

9. The method of manufacturing a light emitting device according to claim 1, wherein bonding surfaces of the light emitting element and the wavelength converting member have a surface roughness (Ra) of 1 nm or less.

10. The method of manufacturing a light emitting device according to claim 1, wherein a temperature to perform a surface activated bonding technique is set not less than 0° C. nor more than 50° C.

* * * * *